United States Patent [19]
Srikrishnan et al.

[11] Patent Number: 5,469,981
[45] Date of Patent: Nov. 28, 1995

[54] ELECTRICALLY BLOWABLE FUSE STRUCTURE MANUFACTURING FOR ORGANIC INSULATORS

[75] Inventors: Kris V. Srikrishnan, Wappingers Falls; James F. White, Newburgh, both of N.Y.; Jer-Ming Yang, Changhua City, Taiwan

[73] Assignee: International Business Machines Corporation, Armonk, N.Y.

[21] Appl. No.: 323,196

[22] Filed: Oct. 14, 1994

Related U.S. Application Data

[62] Division of Ser. No. 192,760, Feb. 7, 1994, Pat. No. 5,389,814, which is a continuation of Ser. No. 23,278, Feb. 26, 1993, abandoned.

[51] Int. Cl.$^6$ ................................................ H01B 13/00
[52] U.S. Cl. ........................ 216/13; 216/21; 216/67; 216/41
[58] Field of Search .................... 156/643, 653, 156/656, 657, 659.1, 662, 664, 665, 901, 902; 216/13, 16, 21, 41, 66, 67, 74, 75, 79, 96, 99, 100

[56] References Cited

U.S. PATENT DOCUMENTS 4,602,420  7/1986  Saito ........................ 437/922
4,931,353  6/1990  Tanielian ..................... 437/922

*Primary Examiner*—William Powell
*Attorney, Agent, or Firm*—Harold Huberfeld

[57] ABSTRACT

An electrically blowable fuse structure usable with organic insulators in microelectronic parts is provided. The fuse structure is made of a first heat resistant member, a fusing element and a second heat resistant member. The heat resistant members are in substantial contact with the fuse and thermally insulate the fuse from the organic insulator. The ends of each fuse are electrically connected to a pair conductors.

A process for fabricating an electrically blowable fuse structure usable with an organic insulator is provided. A substrate with an organic insulator coating and containing electrically conductive features with exposed contacts is provided. A heat shield layer and a fuse layer are deposited sequentially and patterned by subtractive etching. Plurality of conductors are formed over so as to electrically connect each fuse element to a pair of conductors. A second heat resistant member is formed over the fuse area and the substrate is subsequently quoted with an organic insulator.

8 Claims, 4 Drawing Sheets

ELECTRICALLY BLOWABLE FUSE STRUCTURE MANUFACTURING FOR ORGANIC INSULATORS

CROSS-REFERENCES TO PENDING APPLICATION

This application is related to application Ser. No. 07/990,679 filed on Dec. 15, 1992, now U.S. Pat. No. 5,285,099. This application is a division of U.S. Ser. No. 08/192,760 filed on Feb. 7, 1994, now U.S. Pat. No. 5,389,814, which is a continuation of U.S. Ser. No. 08/023,278 filed on Feb. 26, 1993, now abandoned.

FIELD OF THE INVENTION

The present invention relates generally to the field of electrically blowable fuses used in microelectronics, and specifically to fuses that are integrated into substrates, semiconductor devices, ceramic substrates and PC boards.

BACKGROUND OF THE INVENTION

The use of fuses in electrical circuits for the purpose of selecting a specific circuit from an array of components and/or for removing a bad circuit is well known. The fuses change from a conductor to an insulator on "activation", which is defined as any process that causes a change in the state of the fuse. Since the fuse is located at a local spot on the chip, the commonly used techniques for "activating" the fuse are (1) passing a sufficiently large current through the fuse elements; (2) focussing a laser or other energetic beam, and (3) sometimes a combination of both. The fuses are usually made of metallic conductors and occasionally polysilicon. For fuses utilizing metallic conductors, activation refers to the local melting of the fuse element, causing a break in the conductor. The change in electrical resistance in this case is from a low finite value to an extremely high value.

When the fuse is electrically blown, the metallic fuse is subjected to a high voltage pulse lasting in the range of milli-seconds to micro seconds. A high current pulse heats the fuse very rapidly by joule heating ($I^2R$), raising its temperature to its melting point and sometimes vaporizing a small part of the fuse. When polysilicon fuses are utilized, the poly silicon thin film is recrystallized to change orientation/grain size etc. leading to an increase in resistance. Metallic fuses are preferred in the industry as they provide a substantial change in resistivity on activation. Metallic fuses can also be laser deleted, by focussing a laser beam onto the fuse and melting the fuse material. When the fuse is integrated in a chip, the electrically blowable fuses are built in the multilevel interconnection (MIC) part of the semiconductor. MIC refers to layers of thin film conductors and insulators used to interconnect silicon devices, to form circuits, and to connect to the signal and power I/O's. The insulators used in MIC are usually thin films of silicon dioxide and silicon nitride deposited by PECVD and sputtering techniques. These insulators are part of a group known as inorganic insulators.

In large scale integration, the signal delay time from the MIC has become considerable. The signal travel delay in the MIC is proportional to the product of the resistance of the conductor carrying the signal (R) and the capacitive load (C) on the conductor from adjacent conductors. This is usually known as the transmission delay and is an important consideration for the designers. It has been recognized that lowering permittivity of the thin film insulators used in MIC can minimize signal delay and therefore is desirable for high speed applications. The permittivity of silicon dioxide is approximately 4.0 depending on the deposition technique. It is quite rare to find inorganic insulators with lower permittivities, whereas several organic insulators have permittivities less than 4.0. However, organic insulators have significantly lower thermal stability than inorganics and integration of fuses that are electrically blowable is difficult. It would be highly desirable to be able to use fuses in conjunction with organic insulators in chip wiring or thin film wiring. Table 1 lists some of the organic insulators along with some inorganic insulators and their thermal and dielectric properties.

TABLE 1

| Material | Permittivity | Thermal Stability/Melting Point |
|---|---|---|
| SiO2 | ~4.0 | ~1700 |
| Si3N4 | ~7.0 | ~1900° C. |
| Polyimides | 2.5 to 4.0 | 400° C. |
| Teflon | 2.0 | <300° C. |
| SiCr | — | 1650° C. (melting) |

It is therefore a feature of the present invention to provide a fuse that can be used with organic insulators in microelectronic parts.

Another feature of the present invention is to provide a process of building a fuse by known microelectronics manufacturing techniques.

Yet another feature of the present invention is to provide a fuse that can be electrically blown.

A further feature of the present invention is to provide an electrical blowing operation that does not degrade the MIC structure and functionality.

SUMMARY OF THE INVENTION

An electrically blowable fuse structure usable with organic insulators in microelectronic parts is provided. The fuse structure is made of a first heat resistant member, a fusing element and a second heat resistant member. The heat resistant members are in substantial contact with the fuse and thermally insulate the fuse from the organic insulator. The ends of each fuse are electrically connected to a pair of conductors.

A process for fabricating an electrically blowable fuse structure usable with an organic insulator is also provided. A substrate with an organic insulator coating and containing electrically conductive features with exposed contacts is provided. A heat shield layer and a fuse layer are deposited sequentially and patterned by subtractive etching. A plurality of conductors are formed over the fuse layer so as to electrically connect each fuse element to a pair of conductors. A second heat resistant member is formed over the fuse area and the substrate is subsequently coated with an organic insulator.

BRIEF DESCRIPTION OF THE DRAWINGS

The objects, features and advantages of the invention will be apparent from the following more particular description of the invention illustrated in the accompanying drawings, in which.

DETAILED DESCRIPTION OF THE INVENTION

Figure 1A:
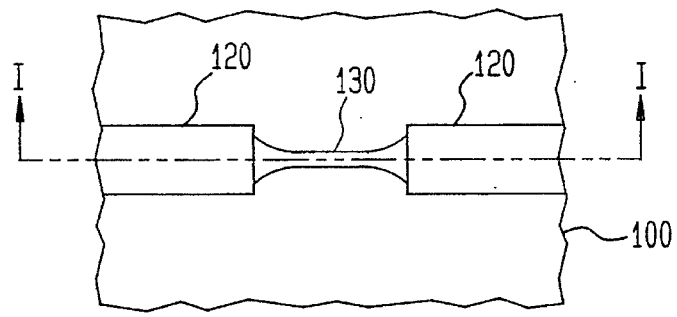
FIG. 1A shows a top view of a known electrically blowable fuse.
Figure 1B:
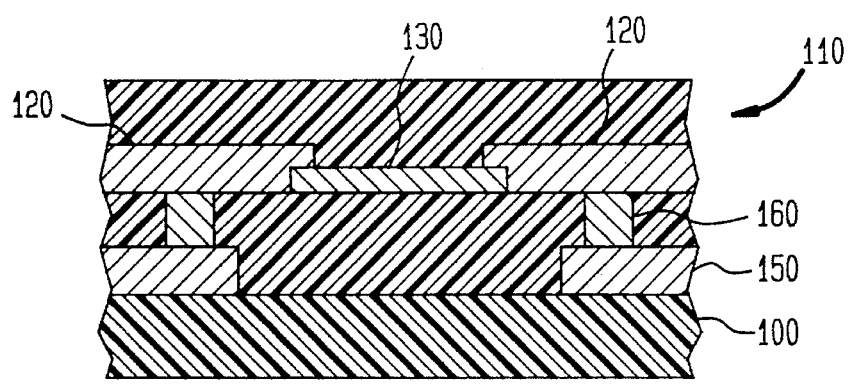
FIG. 1B shows a cross-section of the fuse shown in FIG. 1A taken along I—I.

Referring to FIG. 1A, a typical geometrical shape of an electrically blowable fuse element is shown. The shape provides a narrow spot or region of the fuse, most susceptible to melt, when a voltage pulse (and a current pulse) is impressed on the fuse. Electrically blowable fuses are typically located as part of the interconnection network, above the devices on a substrate. Although the present invention will generally be described herein with respect to the formation of electrically blowable fuses on integrated chips, it is equally conceivable to locate these fuses in other types of microelectronic devices, such as ceramic substrates and PC boards. In all such cases, the concepts of the present invention can be applied with minimum modifications and without deviating from the essential teachings of the present invention. Referring to FIGS. 1A and 1B, fuse 130 is shown as part of a multilevel interconnection portion 110 on a substrate 100. The interconnection portion 110 essentially consists of conductors separated by insulators. Although not shown, conducting film 150 makes electrical contact to the desired devices in substrate 100. Conductor 120, is connected to the conductor 150 by means of a via or stud conductor 160. All the conducting patterns are insulated and isolated by a suitable thin film insulator. In the example shown in FIG. 1B, the fuse is located in a wiring layer containing conductors 120 and connected on either end to conductors 120.

Figure 2:
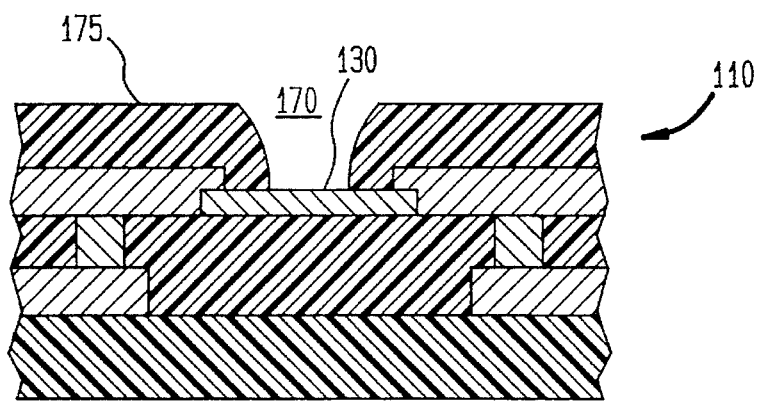
FIG. 2 shows a cross sectional view of a known laser blowable fuse.

FIG. 2 shows a cross section of a laser blowable fuse known in the art, where an aperture opening 170 is made in the insulator 175 over the fuse 130. This allows the use of a laser beam to dissect the fuse. The opening 170 allows for fine focussing of the beam to a small spot, which minimizes the space surrounding the fuse damaged (damage volume) by the heating. In discussions here, the damage volume refers to a volume of material surrounding the fuse both laterally and vertically, that is altered by the fuse blowing process. This volume, by design is kept small. Usually conducting layers are routed outside of this volume by design.

Figure 3A:
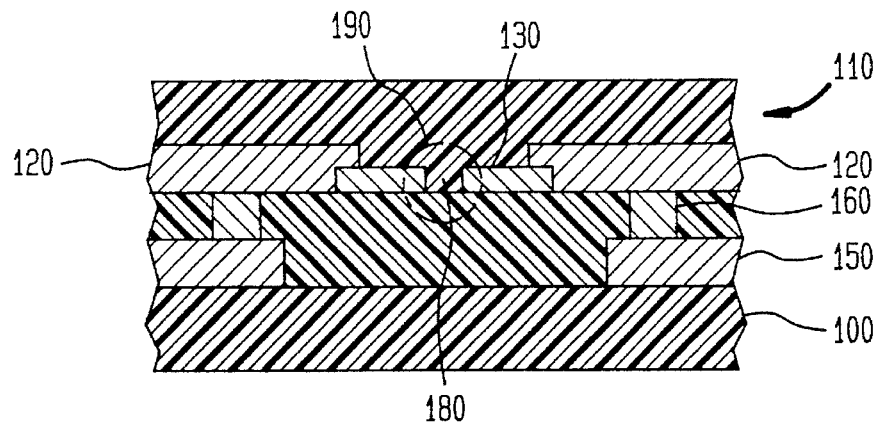
FIGS. 3A and 3B illustrate the impact on the adjacent space of electrically blowing a fuse, with FIG. 3A illustrating the case when a plasma oxide is used as the insulator and FIG. 3B illustrating the case when an organic insulator is used.
Figure 3B:
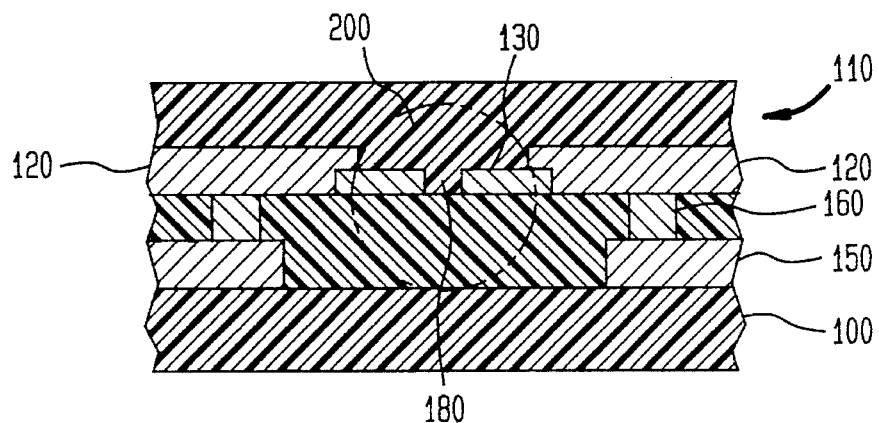

FIGS. 3A and 3B illustrate the effect of the insulating material used on the resultant damaged volume with SiCr electrically blowable fuses. FIG. 3A shows that with the use of plasma oxide insulator that the damage volume 190 is highly localized. However when organic insulators are used as shown in FIG. 3B, the damage volume 200 is large. The present inventors have discovered that the damage of the surrounding material and the volume of damage from the fuse blowing process, is affected by the thermal response of the material immediately adjacent to the fuse. This is the case even though the energy released from the fuse blowing operation is small. For example, the energy release is approximately equal to the volume of fuse melting multiplied by the latent heat of melting of the fuse. Alternatively, it is the impressed electrical energy multiplied by the duration of the pulse. Usually the pulse voltage is less than 10 V, the fuse resistance is on the order of one thousand and the pulse duration is in micro seconds.

The inventors have theorized that at the instant of fuse melting, the organic insulating material in contact with the fuse material, experiences momentary temperatures greatly exceeding its thermal stability. A small volume of material is volatilized, creating a large volume of gaseous products. The sudden volume change and the high pressure associated with it, causes damage to a large volume. The present inventors have discovered that a localized heat shield of the fuse immediately surrounding the fuse will act as a temperature quench and prevent the catastrophic volatilization of the organic material.

Accordingly, the heat shield material is chosen with the following attributes: The heat shield material must be electrically insulating and heat resistant, i.e. it should have a higher melting point than that of the fuse material. The thickness of the heat shield is chosen as follows:

$$\text{Shield thickness} = \frac{C \times \text{Fuse thickness} \times \text{specific heat ratio of fuse to shield material}}{}$$

where C is the ratio of the fuse melting temperature to the maximum temperature allowable for the organic insulator (i.e. the lower of the glass transition temperature or the decomposition temperature of the insulator).

In practice, C is usually about 5.0. Based on these discussions and without rigorously solving for specific values, the present inventors have found that a range of preferred thickness of the heat shield material is five to ten times that of the fuse thickness. The particular shield thickness within the above range may be dictated by the practical need to limit the thickness of the heat shield for compatibility with the rest of the structure. Usually the organic insulators used in microelectronics applications are stable to 400° C. and most fuse materials melt below 2000° C. The above analysis is at best approximate in dealing with the heat redistribution in parallel plates joined together. The latent melting energy, not accounted for in specific heat calculation, will tend to increase the thickness of the shield material required. The lateral spreading of the heat along the plane of the fuse and shield increases the heat spreading area, and will decrease the thickness of the shield layer required.

For a SiCr fuse of thickness 25 to 50 nm, the preferred embodiment of the present invention uses a heat shield 250 nm thick. The heat shield is preferably plasma deposited silicon dioxide. However, the present invention contemplates the use of other materials such as silicon nitride, aluminum oxide, boron oxide, boron nitride, and silicon oxynitride in addition to silicon dioxide as a heat shield. A useful range of the shield material thickness is 100 to 500 nm. The films can be deposited by a variety of techniques such as sputtering, plasma enhanced chemical vapor deposition, ion beam deposition, evaporation etc. depending on the rest of manufacturing processes.

PREFERRED EMBODIMENT OF THE INVENTION

The preferred embodiments of the invention can be better understood by referring to FIGS. 4A–E and 5A and B.

Figure 4A:
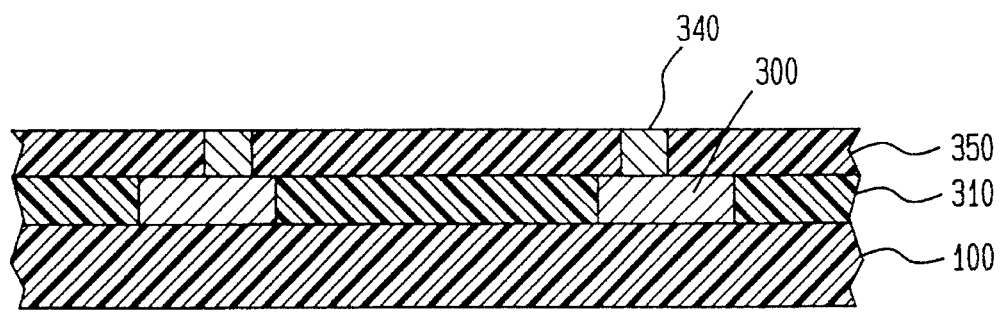
FIGS. 4A–4E show the process sequence of the preferred embodiment of the present invention.
Figure 4B:
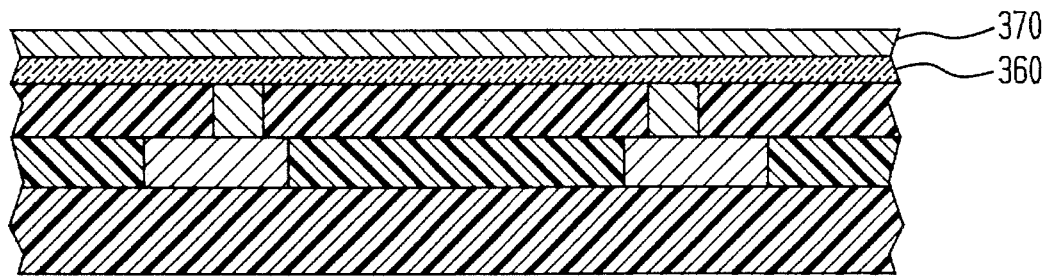
Figure 4C:
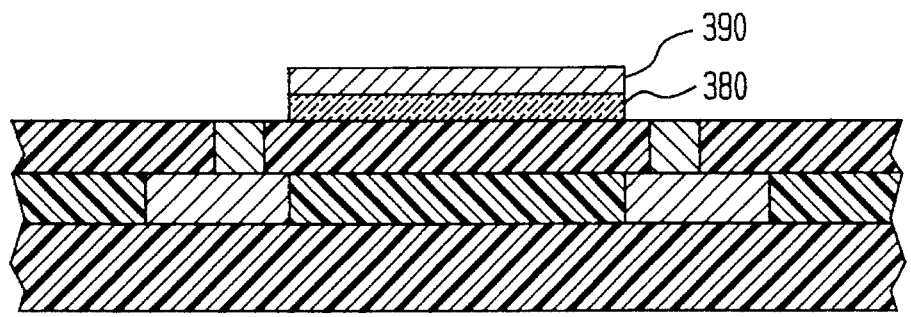
Figure 4D:
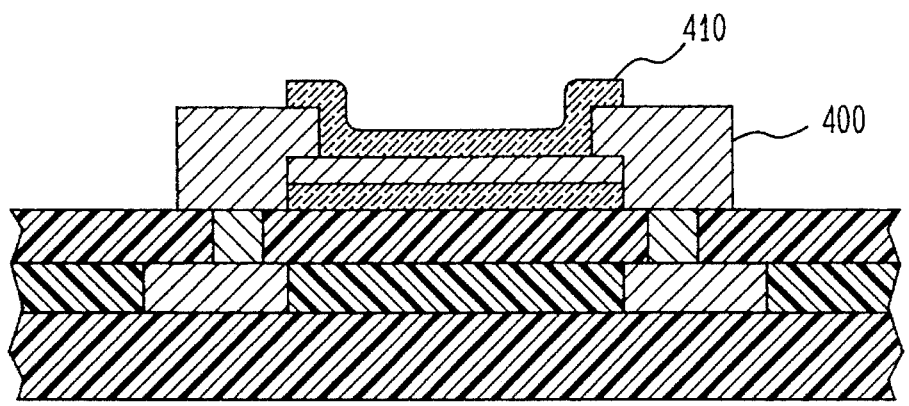

Conductor 300 is connected to the devices in the substrate 100 (not shown) and the device surface is passivated preferably by an inorganic insulator 310. Another conductor 340 is passivated by an organic insulator 350. Depending on the number of levels of wiring and the location of the fuse, the process is repeated. The fuse is located at a selected interconnection level. In the embodiments shown in FIGS. 4 and 5, the fuse is to be located on top of layer 350. At this point a blanket layer 360 of plasma enhanced SiO2 is deposited followed by a blanket deposition of the fuse material 370. Sometimes this blanket layer is a stack of thin films, including the actual fuse layer to facilitate reactive ion etching of the fuse without damaging the active fuse area. The fuse and the underlying SiO2 layer 350 is defined subtractively by photoresist imaging and reactive ion etching. If the fuse 370 is of the SiCr type an O2/CF4 plasma is used in the etching process. The SiO2 layer 350 is also etched in CF4+oxygen in the same apparatus, creating the fuse element 390 and underlying heat shield member 380 made of SiO2 layer as in FIG. 4C. Next the conducting pattern 400 is formed by lift-off techniques or subtractive etching. If subtractive etching is used to form an aluminum conductor using chlorine gases, the fuse surface is protected by a thin layer of tungsten (not shown) which is an etch stop for Al etching. The W layer is subsequently removed by a CF4 plasma in the same etcher used to define the aluminum conductor. Using a blockout mask, a thin heat shield member 410 is formed selectively over the fuse element as shown in FIG. 4D. This is preferably done by depositing a nominal 2500 Å thickness layer of PECVD SiO2 and subtractively etching the SiO2 layer in BHF using a block out resist mask (not shown). Insulating layer 420 is coated on the substrate containing the fuse to complete the device fabrication. The additional steps to complete the chip fabrication, not shown here, include etching openings in insulating layer 420 to provide terminals on the chip for connecting to a substrate. Thus a fuse structure cladded both above and below with a thin layer of heat resistant PECVD SiO2, patterned to completely encapsulate the fusing region of the fuse, is obtained. The fuse may be electrically blown by an 8 V pulse without any visual damage to the polyimide organic insulator layer 420.

Figure 4E:
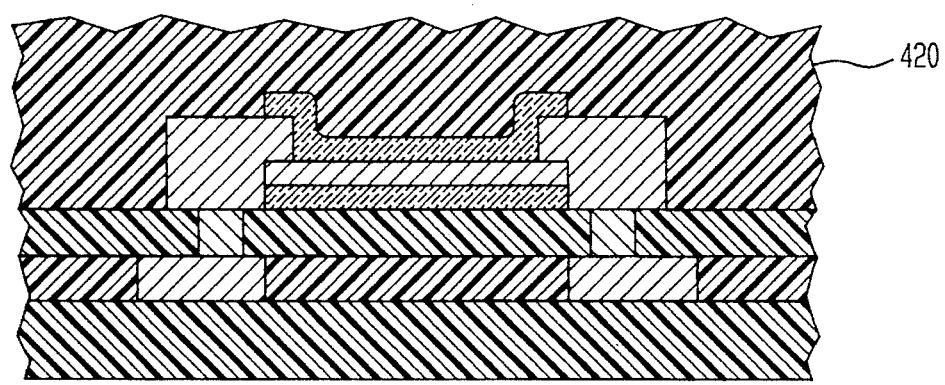
Figure 5A:
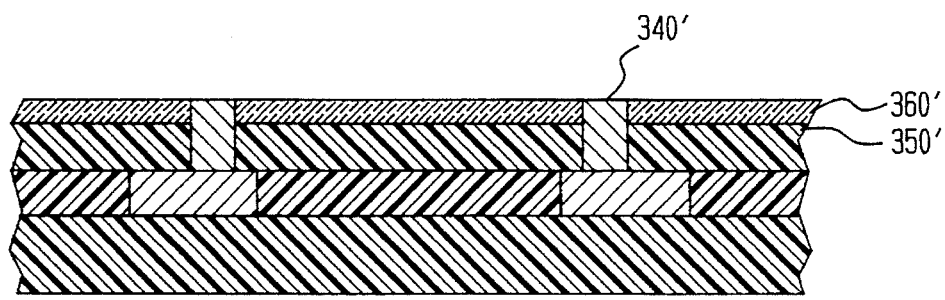
FIG. 5A shows an alternate process step to that shown in FIG. 4A.
Figure 5B:
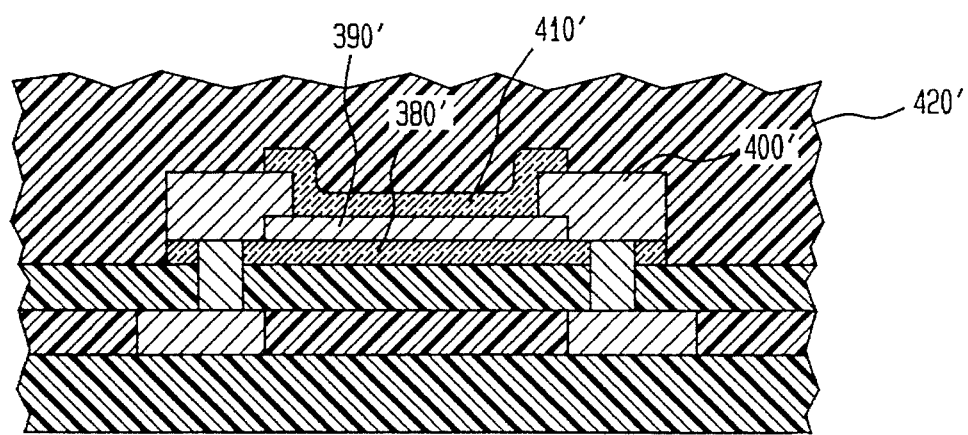
FIG. 5B shows a second embodiment of the fuse of the present invention, if one utilizes process steps as shown in FIG. 5A.

An alternate embodiment of the process of the present invention is shown in FIGS. 5A and 5B, wherein the fuse layer underlying the heat shield can be incorporated into the process steps prior to fuse formation. These steps (not shown) consist of depositing (coating and curing) the organic insulating layer 350' and subsequently depositing a heat shield layer 360'. Using known processes of masking and etching, apertures corresponding to the conducting features 340', are etched in layers 350' and 360'. On metallizing the apertures to provide conducting features 340', the structure shown in FIG. 5A is obtained. The details of the rest of the steps are not shown but are similar to the process discussions earlier. The fuse layer is deposited and subtractively etched to form a fuse 390'. The conductor patterns 400' are next defined such that a pair of conductors electrically contact the ends of the fuse 390'. Using the fuse 390' and the conductor 400' as a mask, the heat shield layer 380' is patterned as shown in FIG. 5B. Next, the heat shield layer 410' is formed selectively over the fuse region. The entire substrate including the conductor and the fuse are coated with organic insulator 420'. A key difference between the fuse structures of FIGS. 4E and 5B is that in the FIG. 4E structure, the bottom heat shield member and the fuse are identical in size and in FIG. 5B, the bottom heat shield member is larger than the fuse element.

Alternate methods can be used as long as the objectives of the invention of cladding the fuse layer with heat resistant layers to thermally insulate the fusing member from the organic insulator is achieved.

While there have been described what are at present considered to be the preferred embodiments of the present invention, it will be obvious to those skilled in the art that various changes and modifications may be made therein, without departing from the invention, and it is, therefore, aimed in the appended claims to cover all such changes and modifications as follow in the true spirit and scope of the present invention.

What is claimed is:

1. A method of manufacturing a reliable fuse structure in contact with an organic insulator, comprising the steps of:

providing a substrate with a surface containing electrical contact areas in a first insulating organic layer, depositing a layer of first heat shield material, depositing a layer of fusing material, patterning said layers of heat shield and fusing material, thereby creating a fuse element and a heat shield member, forming and patterning a plurality of conductors such that the ends of said fuse element are electrically contacted by a pair of said conductors, depositing and patterning a second heat shield member over said fuse element, so as to substantially cover the fuse element, and coating the entire surface of said substrate including said fuse element and said conductors with a second organic insulating layer.

2. The method of claim 1 wherein said steps of depositing first and second heat shield layers, is performed by a process selected from the group consisting of sputtering, evaporation, plasma enhanced chemical, vapor deposition, chemical vapor deposition, and ion beam assisted deposition.

3. The method of claim 1 wherein said step of depositing a fusing material is performed by a process selected from the group consisting of sputtering, evaporation and chemical vapor deposition.

4. The method of claim 1 wherein said patterning of said heat shield and fusing material layers is performed subtractively by one of reactive ion etching and wet etching.

5. A method of manufacturing a reliable fuse structure in contact with an organic insulator comprising the steps of:

providing a substrate with a plurality of first conductors embedded in an insulator, said insulator including openings exposing portions of said first conductors, coating said substrate with a first layer of organic insulator, depositing a first layer of heat resistant material over said organic insulator, etching a plurality of apertures through said first layer of organic insulator and said first layer of heat resistant material to expose said contact areas, patterning a conducting layer to substantially fill said apertures with conducting material to form a plurality of second conductors, depositing a layer of fuse material over said second conductors and said first heat resistant layer, patterning said fuse layer to form a plurality of fuse elements each having first and second ends, depositing and patterning a plurality of third conductors so as to electrically contact said first and second ends of said fuse elements by a pair of said third conductors, patterning said first heat resistant layer to form a plurality of first heat resistant members by etching said layer using said third conductors and said fuse elements as a mask, depositing selectively a plurality of second heat resistant members over said fuse elements so as to substantially cover said fuse elements; and coating said substrate including said third conductors and said fuse structures with a second organic insulating layer.

6. The method of claim 5 wherein said step of depositing said heat shield layer is performed by a process selected from the group consisting of sputtering, evaporation, plasma enhanced chemical vapor deposition, chemical vapor deposition, and ion beam assisted deposition.

7. The method of claim 5 wherein said step of depositing said fuse layer is performed by a process selected from the group consisting of sputtering, evaporation and chemical vapor deposition.

8. The method of claim 5 wherein said step of patterning said fuse layer is done subtractively by one of reactive ion etching and wet etching.

* * * * *